United States Patent
Sanfilippo et al.

(10) Patent No.: US 6,252,402 B1
(45) Date of Patent: Jun. 26, 2001

(54) METHOD FOR CORRECTING AND/OR CALIBRATING MAGNETIC FIELDS, PARTICULARLY INTENDED FOR MAGNETS IN NUCLEAR MAGNETIC RESONANCE IMAGING EQUIPMENT

(75) Inventors: Carlo Sanfilippo; Alessandro Trequattrini; Gianluca Coscia, all of Genoa (IT)

(73) Assignee: Esoate S.p.A. (IT)

( * ) Notice: Subject to any disclaimer, the term of this patent is extended or adjusted under 35 U.S.C. 154(b) by 0 days.

(21) Appl. No.: 09/253,801

(22) Filed: Feb. 22, 1999

(30) Foreign Application Priority Data

Mar. 5, 1998 (IT) ............... SV98A0015

(51) Int. Cl.$^7$ .................. G01V 3/00
(52) U.S. Cl. .................. 324/312
(58) Field of Search .............. 324/312, 309, 324/307

(56) References Cited

U.S. PATENT DOCUMENTS 5,418,462 * 5/1995 Breneman et al. .

* cited by examiner

Primary Examiner—Christine Oda
Assistant Examiner—Dixomara Vargas
(74) Attorney, Agent, or Firm—Burns, Doane, Swecker & Mathis, L.L.P.

(57) ABSTRACT

A method for correcting and/or calibrating magnetic fields, particularly intended for magnets in nuclear magnetic resonance imaging equipment, involves the mathematical description of the field generated by a magnet structure with a harmonic polynomial expansion and the determination of the number, position and magnetization distribution parameters on a predefined distribution grid, related to the magnetic structure, by comparing the polynomial expansion coefficients obtained from a sampling measurement of the actual field with the coefficients of the field having the desired characteristics. The coefficients of the polynomial which can represent the magnetic field are analyzed and subdivided according to the symmetry of the magnetic structure, the systematic coefficients being discriminated from the asystematic ones, depending on their presence, imposed by the symmetries of the magnetic structure, and the groups of coefficients so formed being separately minimized in separate sequences of steps for determining their characteristics as regards number and magnetization distribution and as regards the position of the correction elements.

33 Claims, 4 Drawing Sheets

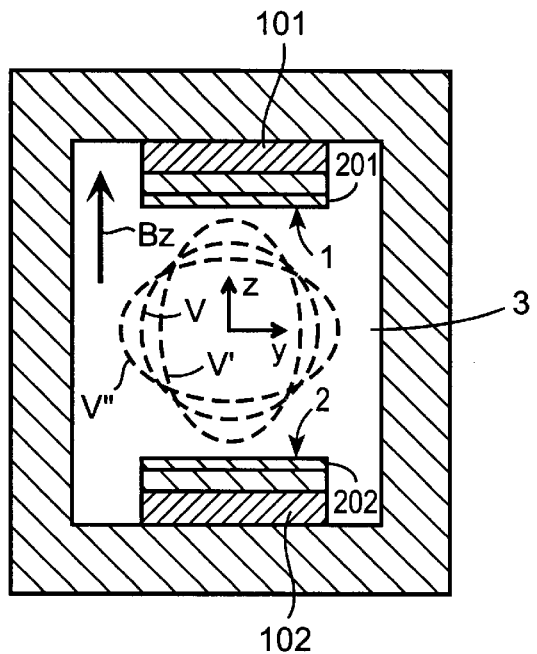
FIG. 2
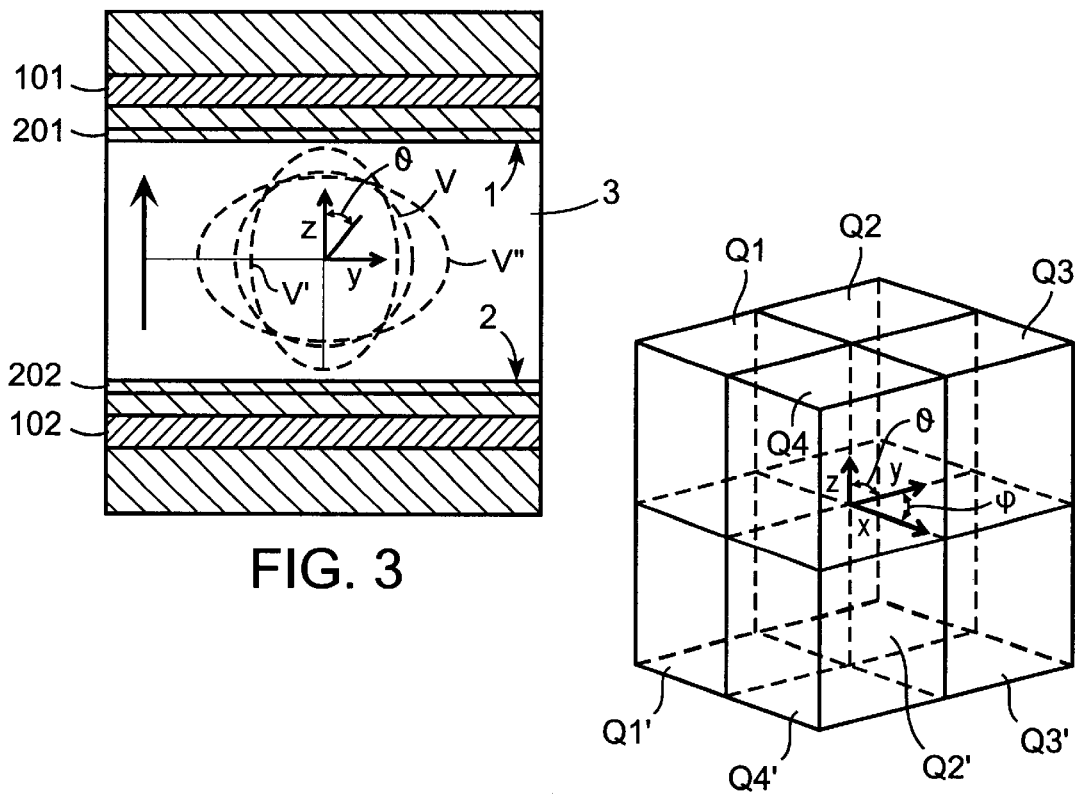
FIG. 3
FIG. 4

TABLE 1

| (n m) | $A^m_n$ | $B^m_n$ |
|---|---|---|
| (1 0) | 0 | |
| (1 1) | 0 | 0 |
| (2 0) | -604.3 | |
| (2 1) | 0 | 0 |
| (2 2) | 197.1 | 0 |
| (3 0) | 0 | |
| (3 1) | 0 | 0 |
| (3 2) | 0 | 0 |
| (3 3) | 0 | 0 |
| (4 0) | 89.9 | |
| (4 1) | 0 | 0 |
| (4 2) | -61.3 | 0 |
| (4 3) | 0 | 0 |
| (4 4) | 75.5 | 0 |

FIG. 5

TABLE 2

| (n m) | $A^m_n$ | $B^m_n$ |
|---|---|---|
| (1 0) | -156 | |
| (1 1) | 38.1 | -11.4 |
| (2 0) | -627 | |
| (2 1) | 4.6 | 3.5 |
| (2 2) | 274 | -8.4 |
| (3 0) | -54.4 | |
| (3 1) | 6.3 | -3.2 |
| (3 2) | -23.4 | -5.9 |
| (3 3) | -12 | -1.7 |
| (4 0) | 91.7 | |
| (4 1) | -0.8 | -3.3 |
| (4 2) | -40.8 | -1.5 |
| (4 3) | 3.3 | -4.3 |
| (4 4) | 73 | 4.8 |

FIG. 6

TABLE 3

| (n m) | $A^m_n$ | $B^m_n$ |
|---|---|---|
| (1 0) | -208.3 | |
| (1 1) | 16.1 | 2.6 |
| (2 0) | 1.5 | |
| (2 1) | -16 | -1.9 |
| (2 2) | -0.3 | -12 |
| (3 0) | -57 | -6.1 |
| (3 1) | -2.4 | -4.4 |
| (3 2) | -20.5 | 1.1 |
| (3 3) | -6 | |
| (4 0) | 0.1 | |
| (4 1) | -2.3 | -6.2 |
| (4 2) | 1.5 | 0.3 |
| (4 3) | -1 | -4.9 |
| (4 4) | 0.5 | 1.7 |

FIG. 7

TABLE 4

| (n m) | $A^m_n$ | $B^m_n$ |
|---|---|---|
| (1 0) | -21.3 | |
| (1 1) | 23.5 | -1.25 |
| (2 0) | -7.3 | |
| (2 1) | -7.4 | -1.8 |
| (2 2) | -0.7 | -9.8 |
| (3 0) | -7.8 | |
| (3 1) | -1.2 | -4 |
| (3 2) | -3.9 | -3.4 |
| (3 3) | -6.6 | 0.7 |
| (4 0) | -1.2 | |
| (4 1) | -2.8 | -5.6 |
| (4 2) | 2.1 | -0.1 |
| (4 3) | -0.9 | -5.1 |
| (4 4) | 0.9 | 1.7 |

FIG. 8

TABLE 5

| (n m) | $A^m_n$ | $B^m_n$ |
|---|---|---|
| (1 0) | -3 | |
| (1 1) | 10.1 | 0.5 |
| (2 0) | -3.6 | |
| (2 1) | -1.4 | -0.5 |
| (2 2) | -4.4 | 1.8 |
| (3 0) | -3.8 | |
| (3 1) | -3.8 | -1.5 |
| (3 2) | -1.1 | -2.5 |
| (3 3) | -1.8 | 1 |
| (4 0) | 0.6 | |
| (4 1) | 2.4 | 0.9 |
| (4 2) | 1.3 | -0.1 |
| (4 3) | -0.8 | -0.4 |
| (4 4) | -0.8 | 0.2 |

FIG. 9

METHOD FOR CORRECTING AND/OR CALIBRATING MAGNETIC FIELDS, PARTICULARLY INTENDED FOR MAGNETS IN NUCLEAR MAGNETIC RESONANCE IMAGING EQUIPMENT

BACKGROUND OF THE INVENTION

1. Field of the Invention

The invention relates to a method for correcting and/or calibrating magnetic fields, particularly for magnets in nuclear magnetic resonance imaging equipment.

2. Background Information

A method for correcting and/or calibrating magnetic fields is currently implemented by using passive ferromagnetic correction means, and coefficients are subdivided according to criteria which change from time to time, depending on magnet structure, field orientation, and other parameters.

The criteria adopted both on processing and on implementation only refer to the magnet structure and anyway are at least partially strongly empirical and governed by experience.

In practical and industrial implementation of such magnets, and especially of equipment making use thereof, such as particularly nuclear magnetic resonance imaging equipment, the use of well-known methods is time-consuming and costly, which affects both productivity and, in intrinsic connection, the final cost of the equipment.

SUMMARY OF THE INVENTION

The invention has the object to provide a method for correcting and/or calibrating magnetic fields of the type described hereinbefore, whereby a targeted and accurate correction may be performed, with a minimum of correction elements and a minimum number of steps.

The invention is substantially based on the acknowledgment that field errors or aberrations in the relevant volume, permeated by the field, are substantially produced by two causes, quite independent from each other. As will be apparent thereafter, thanks to this acknowledgment, the process for correcting and calibrating the magnetic field may be followed by such criteria as to allow the operation to be performed much more quickly and minimizing approaches of the heuristic type or only based on experience. Particularly, this acknowledgment is the basis of processes not depending on specific and instinctive knowledge, which is hardly transferable unless through constant practice. The acknowledgment whereon the invention is based consists in that the aberrations and errors of magnetic fields generated by any magnet structure whatsoever, with respect to a magnet field having predetermined characteristics, imposed by its specific use, are either of the systematic or of the asystematic type. The term aberrations of the systematic type refers to those aberrations caused by the geometrical and physical structure of the magnet, i.e. of the parts meant to generate the field. Conversely, asystematic errors are those deriving from fabrication tolerances, and involving differences between the characteristics of the magnet determined by a theoretical calculation of the field, and the real characteristics thereof. Asystematic errors have a substantially statistical distribution, and depend on fabrication accuracy, on the quality of the material in use, and on mounting and assembly tolerances of the magnet structure. Therefore, asystematic errors might even, under particularly favorable conditions, not appear in any field map, whereas systematic aberrations are always present, although statistically also modulated by construction tolerances.

Several approaches may be provided for the mathematical description of the behavior of the magnet field generated in space by a magnetic structure. The invention is also based on the further acknowledgment that an effective mathematical description of this behavior may be obtained by using, as a reference, the symmetries of the magnetic structure and hence of the field generated thereby, in combination with those of the controlled volume.

The symmetry-based approach has the advantage that it does not depend on a particular system of coordinates in subdividing errors and aberrations into systematic and asystematic groups, and that it simplifies the analysis of aberrations and the calculation of the parameters associated to the correction elements for any magnet structure whatsoever.

Therefore, the invention provides a method of the type described hereinbefore, in which the morphology of the sampling volume of the magnetic field is defined, the coefficients of the polynomial which can represent the magnetic field are analyzed and subdivided into independent groups, according to the symmetries of the selected reference system and of the relevant harmonic functions which are used in the description of the magnetic field, and the independent groups of coefficients are ordered according to the category of systematic or asystematic errors, in accordance with the symmetries of the magnetic structure and with respect to the selected reference system.

For an easier and immediate discrimination of coefficients, by minimizing the number of systematic coefficients, it is preferable to align the symmetries of the morphology of the sampling volume with those of the magnet structure.

The next processing steps derive from this fundamental concept. Particularly, the invention provides the following steps: generating the polynomial which represents the magnetic field with the final desired characteristics, in the form of a general field function consisting in the summation of harmonic terms, (i.e. of orthogonal terms, independent from each other), determining independent groups of coefficients, which describe systematic errors, according to the symmetries of the magnetic structure and with respect to the reference system selected for the controlled volume, processing the field sampling values by the polynomial expansion function, and separately comparing the independent groups of the actual measured coefficients, which describe the systematic errors, with those which describe the final desired characteristics of the field, correlating the polynomial expansion function which describes the field to a grid for positioning the correction elements, calculating the position, magnitude and number parameters of the correction elements by said correlation, as well as by reducing the absolute value of the coefficients under examination below a predetermined maximum value, and optimizing the number of correction elements and the magnitude parameters thereof, and arranging said correction elements in said positioning grid, according to the magnetization distribution, the number and the positions determined.

Moreover, the invention advantageously provides the separate treatment of independent groups of coefficients, with respect both to the category of systematic errors and to the category of asystematic errors.

The mathematical system describing in practical terms the method according to the invention brings to an equation system, which may be easily and quickly solved by numeric means.

If the concept of the invention is more deeply analyzed, the method according to the invention allows to know presumptively which significant errors, due to the finite shape of the magnetic structure, the so-called systematic errors, will occur in the magnetic field. By correcting systematic errors independently from the errors caused by fabrication tolerances, any treatment extended to asystematic errors is avoided.

The method to determine the correction elements for asystematic errors may follow the same steps as described as regards systematic errors.

The grids for positioning the correction elements may be different both as regards systematic errors and as regards asystematic errors.

Thanks to the above method, not only is the number of correction elements of systematic errors reduced, but the number of correction elements of asystematic errors is also dramatically and to a greater extent reduced. The equation system can be solved, if the structure thereof allows so, either precisely or in order to reduce the absolute value of the coefficients below a predetermined maximum value.

The number, position and magnetization distribution parameters of the correction elements for systematic errors, as well as the same parameters for the correction elements of asystematic errors, may be also determined without having to make a precise calculation or to meet maximum threshold requirements, by presumptively defining some parameters, such as the position in the positioning grid or at least one or more position coordinates.

In this case, since processing is quite fast, there may be also provided an array of predetermined positions within the positioning grid, the number and the magnetization distribution parameters of the correction element/s being determined for each position and/or combination of positions of this array, and the combination of number, position and magnetization distribution, which provides the best results in the correction of aberrations, and in the optimization between the number of correction elements and the magnetization distribution parameters, while complying with the predetermined maximum threshold.

It is further possible to assign a predetermined maximum value for the number of correction elements.

The rate whereat the number of correction elements and/or of the individual position coordinates is increased or decreased may be constant or follow a precise and predetermined progression and may be different for any individual correction element.

The grid for positioning the correction elements may not be regular.

Moreover, depending on conditions, calculations may be reiterated for positions situated between those defined by the grid, within the range of certain tolerances.

Generally, when identical magnet structures are used, the positions of the correction elements for systematic errors or aberrations and, under certain circumstances, even the magnetization distribution may be predefined. The values for positions and magnetization distribution will oscillate around a mean, due to construction tolerances. Such error residuals, which may occur due to tolerances may be corrected by applying the above method to the first predetermined systematic correction and by slightly changing certain parameters, such as position and magnetization distribution, from the predetermined ones.

The processing algorithms may be associated to statistical algorithms which direct the choice of the next position parameter according to the results of the processing operations relating to the previous positions.

In magnet structures with poles, a further step allowing a correction of errors and aberrations beforehand, consists in providing that the poles of the magnetic structure are at least partially movable, with respect to their orientation. Particularly, in this case the plates made of a ferromagnetic material, or possibly the plate on the free side of a pole formed by at least two superposed plates made of a ferromagnetic material need only be adjustable with respect to inclination. This may be obtained mechanically in any way, and quite simply.

By this provision, preventive corrections are possible, at least under certain conditions, especially on asystematic errors and possibly even on systematic errors.

Theoretically, the effect of the movement of each inclinable plate being part of one of the two poles may be considered similar to the effect of a correction element having predetermined magnetization distribution and position.

In this case, the invention provides: the analysis of the effects of some inclination directions on independent groups of coefficients and the determination these groups, and the use of said inclinations for minimizing the number or magnitudes of the correction elements corresponding to said groups of coefficients.

BRIEF DESCRIPTION OF THE DRAWINGS

Other objects and advantages of the present invention will become more apparent from the following detailed description of preferred embodiments, when read in conjunction with the accompanying drawings wherein like elements have been represented by like reference numerals and wherein:

FIG. 2 is a schematic view of a magnet for generating annular static fields;

FIG. 3 is a sectional view of the magnet structure as shown in FIG. 2, with respect to a plane perpendicular to that of FIG. 2;

FIG. 4 shows an ideal subdivision of the magnet structure into eight different volumes;

FIG. 5 shows the table of some coefficients relating to the magnetic field calculated according to the magnet structure;

FIG. 6 shows a table of the same coefficients relating to the actually measured field;

FIG. 7 shows the table of the coefficients according to the previous tables after correcting systematic errors;

FIG. 8 shows the table of the coefficients, like that of the previous figures, after correcting a group of asystematic coefficients; and FIG. 9 shows the table relating to the field coefficients once the correction procedure is over.

DETAILED DESCRIPTION OF THE INVENTION

Figure 1A:
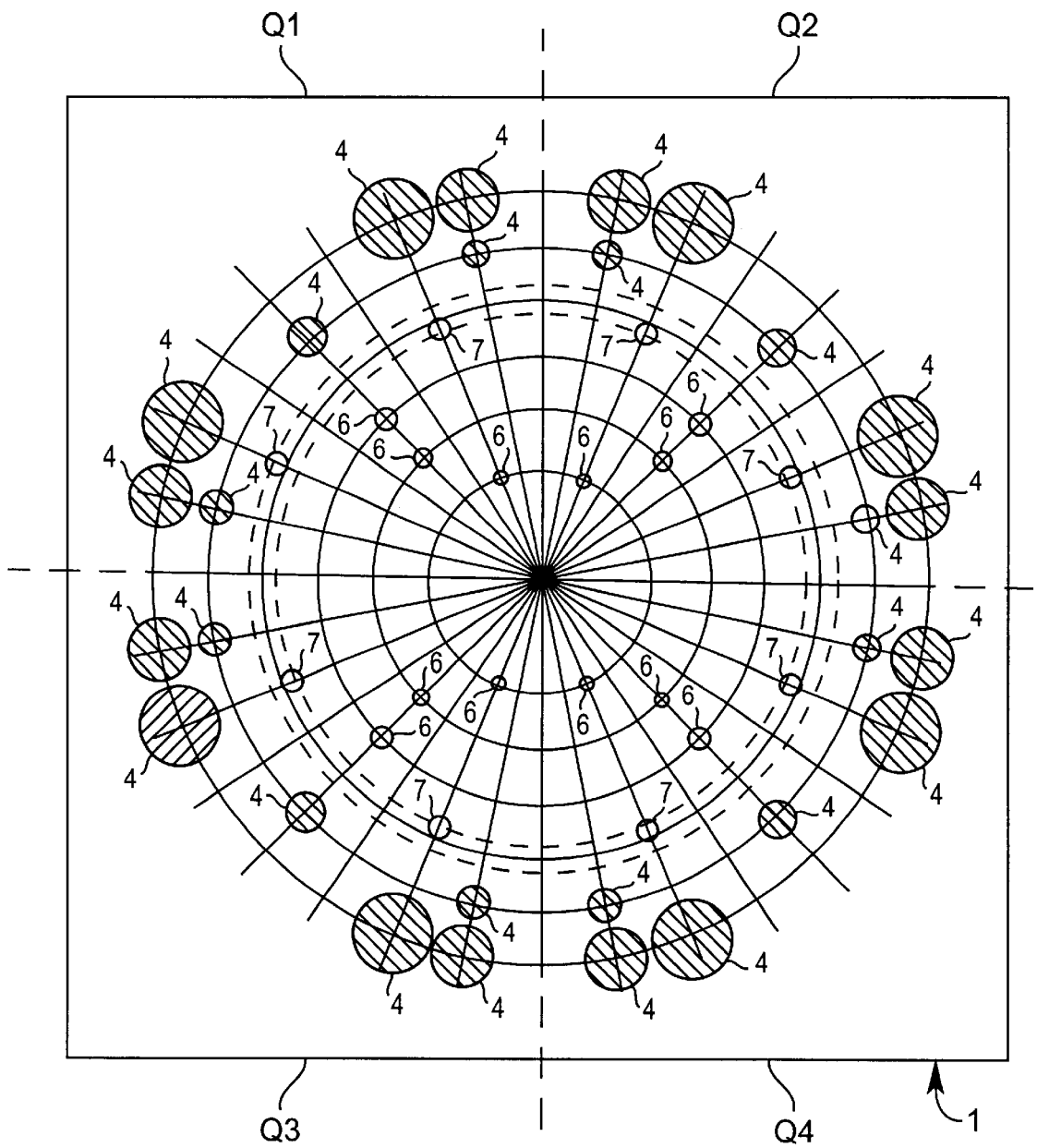
FIGS. 1A and 1B show a distribution of correction elements, obtained through the method according to the invention, and referring to a magnet of the type as shown in FIG. 2, on the two grids associated to the two opposite poles.

FIG. 2 shows a magnetic structure having an annular yoke. It has two opposite poles 1, 2, which delimit a cavity 3 at the top and at the bottom thereof. The poles are associated to members 101, 201 made of a magnetized material, a magnetic field being generated therebetween, mainly in the direction of arrow $B_z$.

The morphology of the sampling volume and the type of harmonics expansion function may be chosen in accordance with the geometry of the magnet and with the designed use thereof. Therefore, FIG. 2 shows, by way of example, both a spherical volume V and a spheroidal volume, with respect to two different orientations of the longer axis V', V".

For the sake of simplicity, this example uses a spherical harmonics expansion, whose geometrical function is:

$$B_z(r, \theta, \varphi) = \sum_{n=0}^{\infty} r^n \sum_{n=0}^{n} P_n^m(\cos\theta)(A_n^m \cos m(\varphi) + (B_n^m \sin m(\varphi)))$$

However, by choosing a spheroid of the V', V" type, the areas of the magnetic field provided with the desired characteristics can be extended both transverse and parallel to the poles, thus fitting bodies having an elongated morphology, in said two directions. The process steps are identical to those described hereafter relating to spherical harmonics.

The preferred choice is that wherein the center of the sphere or spheroid coincides with the center of symmetry of the magnet. The spherical coordinates r, $\theta, \phi$ are defined as follows: r is the radial distance from the center of symmetry; $\phi$ is the angle in the plane x-y with respect to the axis y; $\theta$ is the same with respect to the axis z.

For the annular geometry herein, having a finite axial length, the above expression, subject to the geometrical conditions of the structure, provides a set of coefficients $A_n^m$, which are not equal to zero, only when n and m are even, whereas the remaining coefficients $A_n^m$, $B_n^m$ are null.

The coefficients not equal to zero in the theoretical determination of the field generated by the magnetic structure describe systematic errors caused by the morphology of said structure, which are unavoidable, are present and must be present. The absolute values of systematic aberrations in the static field, caused by the magnetic structure are always of the same order of magnitude and change statistically due to the magnet construction tolerances.

A typical table of coefficients of the spherical harmonics expansion of the magnetic field $B_z$, based both on calculations and on measurements, for the cavity of FIG. 2 is indicated in tables 1, 2 of FIGS. 5, 6.

As is apparent from table 1, the coefficients considerably distant from zero are those whose indexes n and m are even. All other coefficients are zero. These coefficients are always present for magnets having the same geometry, whereas the absolute value thereof may change due to construction tolerances.

The second step of the procedure includes measuring and sampling the actual field generated by such a magnet structure. The distribution and the number of sampling locations arranged on the surface of a sphere, in this case, substantially determines the highest order and degree of coefficients as could be obtained from sampled data without any significant error.

Hence, such distribution and number are chosen in such a way that the coefficients exceeding the highest order and degree do not describe aberrations involving a deteriorated quality of the magnetic field within the predetermined volume.

Then, the measured field values are processed by the above expression describing the field, thus obtaining the coefficients related to the real magnetic field.

Table 2 shows the coefficients $A_n^m$ obtained from processing the samples of the magnetic field. It should be observed that the coefficients with even n, m, are substantially of the same order of magnitude as the coefficients of table 1, whereas the other coefficients are not zero, being distant therefrom even to a considerable extent. These divergences are caused by asystematic errors or aberrations, introduced in the field by construction tolerances, obviously absent in the theoretical calculation of table 1.

The coefficients relating to asystematic aberrations may be subdivided into independent groups according to the different symmetry characteristics of the field generated by the harmonic functions associated thereto, whereon the correction elements for said aberrations is determined by independent groups.

This determination is obtained thanks to the correlation between a distribution of correction elements on a predetermined positioning grid and the expansion describing the field $B_z$ of the magnet, and accounting for the calculated and/or measurable effect of the field generated by the correction magnetized element on the field $B_z$. The number, position and magnetization distribution parameters of the correction elements for systematic aberrations may be determined precisely if the equation system is definite. Alternatively, the calculation may be executed through a succession of attempts, by simultaneously repeating the calculation of the magnetization distribution for different positions of one or more correction elements on the selected positioning grid.

The result of these processing operations is the indication of one or more correction elements in certain positions and with a certain magnetization distribution.

When the geometry of the magnet is always the same, this procedure allows to define a standard set both as regards magnetization distribution, and as regards the number and the position of the correction elements for systematic errors. This set will be substantially the same for all the magnets of the same type and will produce, on the average, the same effects.

Such a standardization of the correction of systematic aberrations may include the above described first correction step, aimed at improving the systematic correction, whereby it is possible to determine slight variations of magnetization distribution or of position.

Figure 1B:
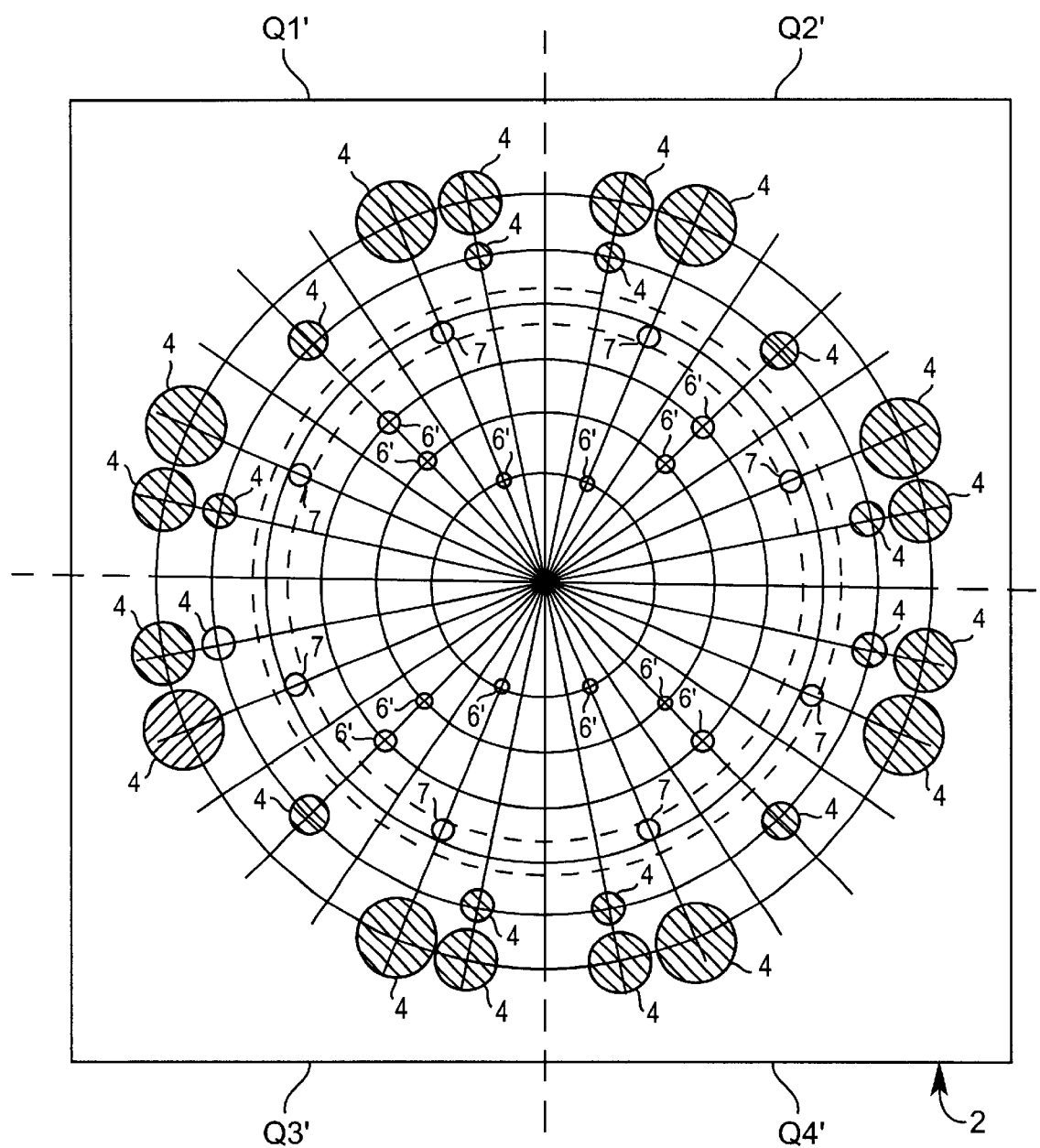

With reference to FIGS. 1A and 1B, on the poles 1 and 2 there is provided an ideal positioning grid, consisting of a sequence of concentric rings, and of an array of radiuses, intersecting them. This defines a grid of positions in angular and radial coordinates. In FIGS. 1A and 1B, the hatched elements represent the correction elements for systematic aberrations and are indicated as 4.

The choice of the distribution grid as shown in FIGS. 1A and 1B is particularly suitable to the geometries in use. The number of elements, the positions and the magnetization distribution of the individual correction elements may be determined for a single quadrant.

The mathematical description of the grid related to the mathematical description of the field allows to generate an equation system, wherefrom the position on the grid and the magnetization distribution of magnetic dipoles, which form the correction elements 4, may be determined.

As a rule, the calculation does not require an optimization procedure consisting in annulling the groups of systematic coefficients, but the number, position and magnetization distribution parameters of the correction elements are determined by lowering said groups of actual coefficients below a predetermined maximum threshold.

In any case, when the groups of coefficients related to systematic errors are annulled or lowered below the maximum threshold, significant errors or aberrations are generally removed, still aiming at an optimal balance between the number of correction elements, the magnetization distribution and the volumetric size thereof.

The groups of systematic coefficients may be corrected before or after correcting the groups of asystematic coefficients, since the correction of each group does not alter, theoretically, the coefficients of the other groups. Insignificant alterations may occur due to magnetic tolerances and to positioning tolerances of the correction elements.

Regardless of the annulment of the groups of systematic coefficients, an example thereof being reported in table 3, the groups of asystematic coefficients are individually annulled or reduced below the maximum threshold. The procedure is similar to the above description related to systematic errors or aberrations. Table 3 shows the values of coefficients, obtained after correcting systematic aberrations, by further sampling the magnetic field.

Although the equation system may be such that the parameters of the correction elements of the groups of coefficients related to asystematic errors or aberrations can be determined in the same manner as described above as regards the parameters of the correction elements related to systematic errors or aberrations, more advantages are obtained by determining the parameters of the correction elements related to asystematic errors in another manner.

In order to determine the parameters of the correction elements more quickly, it is possible to predefine at least a few positions of the elements on the grids, for example by providing an array of different predetermined positions of the correction elements and by calculating the magnetization distributions so as to obtain coefficients below the predetermined thresholds.

By processing the different combinations of number, of position, and by choosing among the many possible solutions the one involving the best results, the correction elements, their number and positions within the positioning grid, and the magnetization distribution may be satisfactorily determined with a relatively small number of steps.

It is also possible to set a limit to the number of repeated attempts of selected combinations, creating or setting a predetermined scheme for the selection of combinations and the permutation thereof. Such a limit may be based either on experience or on continuously updated statistics, determined by the algorithm.

This calculation is repeated for each independent group of coefficients generated by the same symmetry characteristics.

Then, the correction elements so determined are fixed in the resulting positions on the positioning grid which is provided, in the example shown without restriction on each pole 1, 2. One example is shown in FIG. 1, wherein the correction elements for asystematic errors are indicated as 6, 6'.

With reference to the elements indicated as 7, both for correction elements intended to remove systematic aberrations, and for those intended to remove asystematic aberrations, positions may be also provided within a predetermined tolerance range. Hence, the correction elements may be also positioned in slightly staggered positions, either radially or angularly with respect to a predetermined precise position. This staggered position may be determined either on the basis of experience, i.e. empirically, or after a precise calculation, i.e. made with respect to that position.

The operations for correcting systematic and asystematic errors or aberrations may be repeated once or any number of times, so that the field inhomogeneities may be recursively further corrected, where the latter have been minimized to an insufficient extent.

Table 5 shows the result of such a correction, in which the groups of coefficients have been reduced to such an extent as to comply with strict maximum threshold tolerances for coefficients. The tolerance is provided in accordance with the characteristics of a static magnetic field of a nuclear magnetic resonance machine.

When the above steps of the method are more deeply scrutinized, with reference to FIG. 4, the magnet structure may be defined as composed of eight geometrically identical octants, whose permanent magnetic material has always the same magnetization direction and sense(along the axis z). This subdivision involves the subdivision of the two opposite grids each in four quadrants Q1, Q2, Q3, Q4 and Q1', Q2', Q3', Q4'. The controlled volume, in this case being a sphere, is advantageously centered with respect to the magnet cavity (although this is not absolutely necessary).

Once a magnetization distribution $M(r, \theta, \phi)$ is defined in the first octant, i.e. in one of the quadrants of one of the grids, the magnetization distribution in the remaining seven octants may not be determined. It will result from symmetrical positioning the other correction elements, for example, but without restriction, according to the following rules:

$M(r, \theta, -\phi) = M(r, \theta, \phi) * s1$ $M(r, \theta, 180-\phi) = M(r, \theta, \phi) * s2$ $M(r, 180-\theta, \phi) = M(r, \theta, \phi) * s3$ with $S=(s1, s2, s3)$ and with s1, s2, s3 having possible values $\pm 1$. S is a vector which identifies the relevant symmetry and so a certain group of coefficients. There are eight symmetry vectors a priori, defining the groups of coefficients, which are listed in the following table:

| s1 | s2 | s3 | $A^n_m$ | $B^n_m$ |
|---|---|---|---|---|
| 1 | 1 | 1 | ≠ even n even m | 0 |
| -1 | -1 | -1 | 0 | odd n odd m |
| 1 | -1 | 1 | odd n odd m | 0 |
| 1 | 1 | -1 | odd n even m | 0 |
| -1 | -1 | 1 | 0 | even n even m |
| -1 | 1 | -1 | 0 | even n odd m |
| 1 | -1 | -1 | even n odd m | 0 |
| -1 | -1 | -1 | 0 | odd n even m |

According to the selected symmetry (s1, s2, s3), only coefficients A and B with even or odd n and m will be generated. So, the array of coefficients is subdivided into eight groups, reflecting the symmetries in use.

It clearly appears that by positioning the magnetization sense $M(r, \theta, \phi)$ according to the symmetry imposed by S, it is possible to selectively compensate only one group of coefficients, leaving the others unchanged, except small but inevitable deviations, caused by tolerances in positioning and magnetizing the material. From the comparison between tables 2 and 3 (correction of systematic coefficients) and 3 and 4 (correction of one group of asystematic coefficients), it clearly appears that the correction of the coefficients of one symmetry only slightly perturbs, due to tolerances, the coefficients of the other symmetries.

The table of symmetries and table 1, relating to the design coefficients, show that systematic errors or aberrations are reflected by the symmetry corresponding to the vector S (1, 1, 1). According to the above description, once the position of a correction element 4 has been defined on an octant (in spherical coordinates determined by the coordinates (r, θ, φ)) and therefore on a quadrant of one of the two grids for positioning the correction elements, with respect to the magnet structure and to the position of the system of coordinates, systematic coefficients (i.e. of the same type as those generated by the magnet structure itself), and of no other type, can be generated by symmetrically positioning other seven objects in their respective seven octants, i.e. in the other three quadrants of the first grid and in the four quadrants of the other grid, choosing the same magnetization sense as that of the correction element placed in the first octant, i.e. in the first quadrant of the first grid.

Therefore, the positions will be: (r, θ, φ), (r, θ, −φ), (r, θ, 180−φ), (r, θ, 180+φ), (r, 180−θ, φ), (r, 180−θ, −φ), (r, 180−θ, 180−φ), (r, 180−θ, 180+φ). An object in the position (r, θ, φ) will help to generate a determinable and/or measurable quantity of coefficients A with even n and m. Such values will be identical to those obtained for the seven other symmetrical objects in the above indicated positions, and with the same magnetization sense. Each object or correction element generates other asystematic coefficients, but by simultaneously positioning all eight correction elements defined (as to position and magnetization sense), a theoretical null value is obtained for all these other coefficients.

The comparison between tables 3 and 4 shows that there is a group of coefficients A with odd n and m, hence corresponding to a symmetry vector S=(1, 1, −1) (see previous table). Octant-based correction, i.e. based on quadrants of distribution grids, is made orienting the magnetization sense of the material according to said symmetry vector S=(1, 1, −1) and requires that in all the quadrants of a first grid, selected to define the position of the first correction element/s, the latter have identical magnetization sense and magnitude, whereas in the quadrants of the second positioning grid, associated to the other pole, the magnetization sense, i.e. polarity, is inverted, while the positions are unchanged. This condition is apparent from FIGS. 1A and 1B, the correction elements related to the group of coefficients associated to this symmetry being indicated as 6 in the first grid and as 6' in the second grid.

While examining all the symmetries, the different groups of coefficients are corrected in the same manner as described for symmetries S=(1, 1, 1) and S=(1, 1, −1), thus obtaining the correction of errors or aberrations foreseen for the other groups of coefficients.

The steps for determining the number, position and magnetization distribution of the correction elements for each group of coefficients, representing either systematic or asystematic errors are followed according to the above description of the most general part of the method. The above method is also directly applicable to magnets involving a different fabrication and/or a different configuration, such as a U- or C-shaped magnet.

According to a further variant of the method according to the invention, in case of magnet structures with poles, the number of the correction elements for systematic and/or asystematic errors may be minimized, by inclining the poles. In this case, the ferromagnetic plates 201, 202, which form the two opposite poles are supported so as to be able to move with respect to their orientation. This may be provided by means of movable supports for these plates, in combination with moving means, for example pushing pins, each associated to a peripheral area of the plate 201, 202. In this way, it is possible to correct, or anyhow vary the inclination of said plate 201, 202, with respect to the horizontal plane.

The above description clearly shows the considerable simplicity, versatility and adaptability of the method according to the invention. By making use of the concept to order the coefficients in independent groups according to the symmetries provided and to the choice of the reference system for the controlled volume, easier operations to calculate the correction method are obtained, and the approach is no longer bound to the particular morphologies of the sampling volumes in use. The shape of the magnet structure and the characteristics of the field are only expressed by the presence or absence of a symmetry. Moreover, by establishing fixed positioning grids, at least for a specific strip around the positions defined by the grids, the calculation times are reduced. The method according to the invention provides the combination of different correction elements with different magnetization values, to obtain any necessary magnetization value.

This allows to obtain a reduction of the number of different pieces for different values of magnetization distribution, thus limiting the costs for storing a sufficient number of pieces.

Naturally, the invention is not limited to the above description and illustrations, but may be greatly varied, without departure from the guiding principle disclosed above and claimed below. The harmonic expansion of the expression describing the field may also occur with reference to other types of harmonic functions. The grids for positioning the correction elements may also be different from the illustrated one, and may be both plane and provided on three-dimensional or curved surfaces. In order to determine the characteristic parameter of the correction elements, different types of approximation algorithms may be used. The choice may depend on the geometry of the magnet structure and on the symmetry of the magnetic field, as well as on the morphology of the sampling volume. It has to be intended that the method according to the invention always leads to the optimization of the field, even regardless of the particular choices made, and of the possibility that they provide a faster and more convenient calculation and application of the correction elements.

The latter may be made both of a permanently and non-permanently magnetized material or of combinations of said materials. Moreover, the correction elements may have different shapes, such as disks, parallelepipeds, plates, or else.

A further remarkable advantage of the method according to the invention consists in that small corrections may be performed, for variations due to the different environmental installation conditions, very quickly, easily and with a very little effort, such that they may be made by specifically trained personnel, but without high-level scientific knowledge.

According to an advantageous improvement, the step, wherein the correction elements for systematic or asystematic errors are positioned may be subdivided into two or more steps, in which only a part of the correction elements are positioned on the grid. Between said steps a verification sampling operation is provided, and the calculation of the remaining correction elements is repeated. According to the result of this calculation and to the comparison with the result of any previous verification sampling or calculation operations between two steps and/or according to the result of the first sampling operation, different options may be selected: a subsequent positioning step, based on the result of the first initial calculation of the correction elements or on any verification calculation, thus accomplishing the positioning of the correction elements; or with a further step, for positioning another part of the correction elements, based on the result of the initial calculation or of the verification calculation, following any one of the previous sampling operations; and/or performing again or retouching the first or the previous correction step/s; or providing a combination of these options.

When more than two positioning steps are provided, there may be provided a verification sampling step after each positioning step for its respective part of the correction elements.

This allows both to keep the effect of the positioning and magnetization distribution tolerances of the correction elements under control, and to verify, locate and possibly immediately correct possible errors limited to a restricted number of pieces positioned with respect to the totality thereof.

With reference to FIGS. 1A and 1B, for example, the correction of systematic coefficients, obtained by means of the elements 4 is made by determining the parameters of all the correction elements, and by arranging on the grid only those of a few innermost circle/s. The result of the verification sampling operation and of the calculation of the remaining correction elements will show the possible need to keep on positioning the remaining correction elements 4 of a/the group of outer rings, according to the parameters determined with the first calculation, to retouch those positioned earlier and/or to use for the remaining correction elements of a/the group of outer rings, the elements whose parameters have been defined in the second verification calculation, or to provide a combination of the latter steps.

If there were three or more rings for positioning the correction elements 4, instead of placing the correction elements 4 only on two rings, after positioning the correction elements on the intermediate ring, it would be possible to repeat the above verification steps, starting from the innermost ring, and choosing among the options indicated to position the correction elements on the third outermost ring, and so on. When the number of rings is still higher, advantages might be obtained from providing intermediate verification sampling steps between the steps for positioning the correction elements on a group of rings. Obviously, the arrangement on rings is not to be intended by way of restriction. The progressive steps for positioning parts of the correction elements with respect to the geometrical distribution of their positions depend on the geometry of the selected grid.

It will be appreciated by those skilled in the art that the present invention can be embodied in other specific forms without departing from the spirit or essential characteristics thereof. The presently disclosed embodiments are therefore considered in all respects illustrative and not restricted. The scope of the invention is indicated by the appended claims rather than the foregoing description and all changes that come within the meaning and range and equivalence thereof are intended to be embraced within.

What is claimed is:

1. A method for correcting and calibrating magnetic fields for magnets in nuclear magnetic resonance imaging equipment, comprising the steps of:

generating a polynomial representing the magnetic field generated by the magnet and comprising a plurality of harmonic terms, each associated to a coefficient;

measuring the magnetic field and sampling it in a plurality of locations, with a predetermined space distribution;

determining the coefficients from the sample values in the field;

comparing the measured coefficients with those describing the field with desired characteristics;

defining a grid for positioning the correction elements, depending on the magnet structure and on the correlation thereof with the field structure; and calculating the position and magnitude parameters of one or more correction elements to obtain the desired field characteristics, wherein a morphology of a sampling volume of the magnetic field is defined, the coefficients of the polynomial which can represent the magnetic field are analyzed and subdivided into independent groups, according to symmetries of a selected reference system and of a relevant harmonic function which is used in a description of the magnetic field;

independent groups of coefficients are discriminated and ordered according to their belonging to categories of systematic or asystematic errors, in accordance with symmetries of magnetic structure and with respect to the selected reference system;

the independent groups of coefficients so formed are separately annulled or lowered below a maximum threshold absolute value, following a series of calculation steps, for determining the number, magnetization distribution, and position characteristics of the correction elements with reference to the magnetic structure.

2. A method as claimed in claim 1, comprising the steps of:

generating the polynomial which represents the magnetic field with the desired characteristics, in the form of a general field function con of harmonic terms;

determining independent groups of coefficients, which describe systematic errors, according to the symmetries of the magnetic structure and with respect to the reference system selected for the controlled volume; and processing the field sampling values by the polynomial expansion function, and separately comparing the independent groups of the actual measured coefficients, which describe the systematic errors, with those which describe the desired characteristics of the field;

a) correlating the polynomial expansion function which describes the field to a grid or criteria for positioning one or more correction elements; b) calculating the position, magnetization distribution magnitude, and number parameters of the correction elements by said correlation, as well as by reducing absolute values of the coefficients under examination below a predetermined maximum threshold, and optimizing the number of correction elements and the magnitude parameters thereof; and c) arranging said correction elements in said positioning grid, according to the magnetization distribution, the numbers and the positions determined.

3. A method as claimed in claim 1, wherein in order to determine the position, magnetization distributions, and number parameters of the correction elements for aberrations described by each independent group of coefficients belonging to the category of asystematic errors or aberrations, the same steps as those followed with respect to the groups of coefficients related to systematic errors are repeated.

4. A method as claimed in claim 1, wherein the grids for positioning the correction elements may be different both as regards systematic errors or aberrations and as regards asystematic errors or aberrations.

5. A method as claimed in claim 1, wherein the positioning grid may extend on plane, curved, or thee-dimensional surfaces.

6. A method as claimed in claim 1, wherein the equation system for determining the number, position, and magnetization distribution parameters of the correction elements for systematic and asystematic aberrations is solved in such a way that the coefficients of each group under examination are below a predetermined maximum threshold.

7. A method as claimed in claim 1, wherein the number, position, and magnetization distribution parameters of the correction elements for systematic errors or aberrations, as well as said parameters for the correction elements of asystematic errors or aberrations, are determined by defining an array of values for one or more parameters, by determining the rest of the parameters of the correction elements for each value of the array, and by selecting the combination of position, number, and magnetization distribution which provides the best results in the correction of aberrations, and in the optimization of the ratio between the number of correction elements, the volumetric size, and the magnetization distribution.

8. A method as claimed in claim 7, wherein the array of values relates to the position parameter of one or more correction elements.

9. A method as claimed in claim 8, wherein the array of values relates to one or some of the coordinates of the position parameter of one or more correction elements.

10. A method as claimed in claim 7, wherein the array of values relates to the magnetization distribution parameter of one or more correction elements.

11. A method as claimed in claim 7, wherein the array of values relates to the parameter describing the number of correction elements.

12. A method as claimed in claim 7, wherein it is possible to combine more arrays of more parameters with each other.

13. A method as claimed in claim 7, wherein a maximum number of correction elements is predetermined.

14. A method as claimed in claim 1, wherein the rate at which the values within an array related to a parameter is increased or decreased is constant and is different for any individual correction element or parameter.

15. A method as claimed in claim 7, wherein the parameters of simultaneous different combinations of correction elements are processed.

16. A method as claimed in claim 1, wherein calculations may be reiterated for positions situated between those defined by the positioning grid, within the range of certain tolerances.

17. A method as claimed in claim 1, comprising an intermediate magnetic field sampling step, before correcting the coefficients related to asystematic errors or aberrations.

18. A method as claimed in claim 1, wherein in case of identical magnet structures the corrections of systematic errors or aberrations are accomplished by predetermined sets of predetermined correction elements, and in the predefined positions for all magnets of the same type.

19. A method as claimed in claim 18, wherein possible improvements of the corrections of systematic aberrations or errors, are deviated from a mean value.

20. A method as claimed in claim 1, wherein the parameters of the correction elements of the asystematic errors or aberrations are determined by calculating, for each correction element, or for a combination of two or more correction elements, the magnetization distribution parameters, according to predetermined arrays of positions in the positioning grid and by selecting the best combinations of number of elements, magnetization distribution, volumetric sizes and position.

21. A method as claimed in claim 1, wherein the processing algorithms may be associated to statistical algorithms, which direct the choice of the next position parameter, within the set of predetermined positions, according to the results of the processing operations relating to the previous positions.

22. A method as claimed in claim 1, wherein an ideal subdivision of the magnet structure into sectors is defined, which subdivision is based on the symmetries of the magnet structure and of the reference system selected for the controlled volume, and on the basis of which subdivision a unitary vector is created to describe the symmetries and asymmetries of the magnet structure, the position and magnetization distribution absolute value parameters being determined with respect to one of the magnet sectors, obtained by the ideal subdivision, whereas in the remaining sectors, the sense of the magnetization distribution of the corresponding correction element/s is defined according to the behavior indicated by the unitary vector of the relevant symmetry or asymmetry.

23. A method as claimed in claim 16, wherein the positioning grids are also subject to a subdivision corresponding to that of the magnet structure and of the field generated thereby.

24. A method as claimed in claim 1, wherein the symmetries of the morphology of the sampling surface or volume are aligned with the symmetries of the magnet structure.

25. A method as claimed in claim 1, wherein certain planes, axes or points of symmetry of the morphology of the sampling surface or volume and of the positioning grids for the correction elements may be staggered with respect to the planes, axes of points defining symmetries and asymmetries of the magnet structure and of the field generated thereby.

26. A method as claimed in claim 1, wherein the correction elements may be permanently magnetized or subject to magnetization by induction by the magnetic field of the magnet structure.

27. A method as claimed in claim 1, wherein it provides a further step for adjusting the inclination of the poles of the magnetic structure.

28. A method as claimed in claim 27, wherein the step for changing the inclination of the poles can be considered similar to the arrangement of the correction elements with a predetermined magnetization distribution and is aimed at minimizing the number of correction elements, compensating for systematic and asystematic errors or aberrations.

29. A method as claimed in claim 1, wherein the correction of the groups of systematic coefficients may be provided before or after the correction of the groups of asystematic coefficients and separately for each group.

30. A method as claimed in claim 1, wherein the step wherein the correction elements for systematic or asystematic errors are positioned is subdivided into two or more steps, in which only a part of the correction elements are positioned on the grid, a verification sampling operation being provided between said steps, and the calculation of the remaining correction elements being repeated, and according to the result of which calculation and to the comparison with the result of any previous verification sampling operations between two steps and according to the result of the first sampling operation, there is provided a subsequent positioning step, based on the result of the first initial calculation of the correction elements or on any verification calculation, thus accomplishing the positioning of the correction elements or there is provided a further step, for positioning another part of the correction elements, based on the result of the initial calculation or of the verification calculation.

31. The method of claim 2, wherein the harmonic terms are orthogonal terms.

32. The method of claim 14, wherein the rate follows a predetermined progression.

33. The method of claim 24, wherein the planes, axes or points defining the sampling surface or volume are aligned with the planes, axes or points defining the magnet structure.

* * * * *

UNITED STATES PATENT AND TRADEMARK OFFICE
CERTIFICATE OF CORRECTION

PATENT NO.     : 6,252,402 B1
DATED          : June 26, 2001
INVENTOR(S)    : Carlo Sanfilippo et al.

It is certified that error appears in the above-identified patent and that said Letters Patent is hereby corrected as shown below:

<u>Title page,</u>
Item [73], Assignee, "Esoate S.p.A." should be -- Esaote S.p.A. --

Signed and Sealed this

Third Day of December, 2002

JAMES E. ROGAN
*Director of the United States Patent and Trademark Office*